United States Patent [19]

Naylor et al.

[11] Patent Number: 4,580,262

[45] Date of Patent: Apr. 1, 1986

[54] RADIO SYSTEMS

[75] Inventors: Michael Naylor; David Brash, both of Reading, England

[73] Assignee: Racal-SES Limited, Bracknell, England

[21] Appl. No.: 557,105

[22] Filed: Dec. 1, 1983

[30] Foreign Application Priority Data

Dec. 8, 1982 [GB] United Kingdom ............... 8234993

[51] Int. Cl.⁴ ..................... H03K 13/34; H04B 7/20
[52] U.S. Cl. ........................................ 371/5; 371/35; 375/58; 455/69
[58] Field of Search ............... 455/73, 10, 15, 52, 455/69, 228, 343, 9, 12; 371/5, 35, 37; 375/58

[56] References Cited

U.S. PATENT DOCUMENTS

| | | | |
|---|---|---|---|
| 3,646,518 | 2/1972 | Weinstein | 371/35 |
| 4,004,224 | 1/1977 | Arens et al. | 455/10 |
| 4,110,558 | 8/1978 | Kagcyam et al. | 371/5 |
| 4,228,538 | 10/1980 | Scharla-Nielsen | 455/9 |
| 4,309,771 | 1/1982 | Wilkens | 375/58 |
| 4,340,973 | 7/1982 | Umetsu | 455/228 |
| 4,471,485 | 9/1984 | Prevot et al. | 371/35 |
| 4,495,648 | 1/1985 | Giger | 455/10 |

OTHER PUBLICATIONS

Ericsson Review, vol. 58, No. 3, 1981, pp. 128-133, E. Lundblad "CONTACT RL400—a New Radio Relay Equipment".

Primary Examiner—Michael R. Fleming
Attorney, Agent, or Firm—Leydig, Voit & Mayer, Ltd.

[57] ABSTRACT

A radio system employs a method of controlling the transmitted power of a radio signal such that a minimum power level for efficient reception is maintained. Data is simultaneously transmitted between two radio stations using an error correction code. Each block of the code is accompanied by a power bit. The transmitted power bit is set high or low in dependence upon whether the number of errors in a sample of received blocks, as determined by processing of the received code, is equal to, above or below a predetermined threshold value. At the other station the received power bit is directed to a power control device and used to adjust the output power of the transmitter of that station by continuously variable slope delta demodulation.

8 Claims, 2 Drawing Figures

RADIO SYSTEMS

BACKGROUND OF THE INVENTION

1. Technical Field

The present invention relates to radio systems and, more specifically, to radio systems adapted to operate at a minimum effective power transmission level. The invention also relates to methods of controlling the transmitted power of a radio signal.

In order to provide maximum security against reception of a transmitted signal by an unauthorised third party, it is desirable to use the lowest possible transmission power that enables effective reception to be achieved at the desired receiving station. During a normal radio transmission there may occur transient losses in signal strength which are known as "fading". Such fading may arise from cancellation of one incoming wave with another which has travelled from the transmitting radio by a different path. Therefore it is not sufficient merely to set the transmitted power level at a suitable minimum value, as any fading during transmission will cause errors at the receiving station.

SUMMARY OF THE INVENTION

Accordingly, the present invention provides a radio system for simultaneous digital communications between two radio stations using data blocks each of which includes a plurality of message bits and at least one non-message bit, each radio station including means for monitoring transmission received from the other radio station and setting the or one non-message bit to be transmitted by the receiving station to the transmitting station to indicate to the transmitting station whether the transmitted signal power is to be increased or decreased to maintain reception, and means at each station for sensing the setting of said non-message bit to adjust the power of the transmitted signal.

The invention further provides a method, for use in a radio system wherein two radio stations are transmitting to each other, of controlling the transmitted power of a radio signal such that a minimum power level to ensure efficient reception is maintained, comprising the steps of detecting at each station the error level in the received transmission from the other station and periodically transmitting to the other station an indication of whether the transmitted power should be increased or decreased in dependance on whether the error level detected immediately prior to transmission of said indication was above or below a predetermined threshold value respectively.

Error level is detected in practical embodiments by measuring the error rate or by monitoring a factor dependent on the error rate, such as the mean time between errors occurring which is more suitable in situations where the error rate is low.

DESCRIPTION OF A PREFERRED EMBODIMENT

Figure 1:
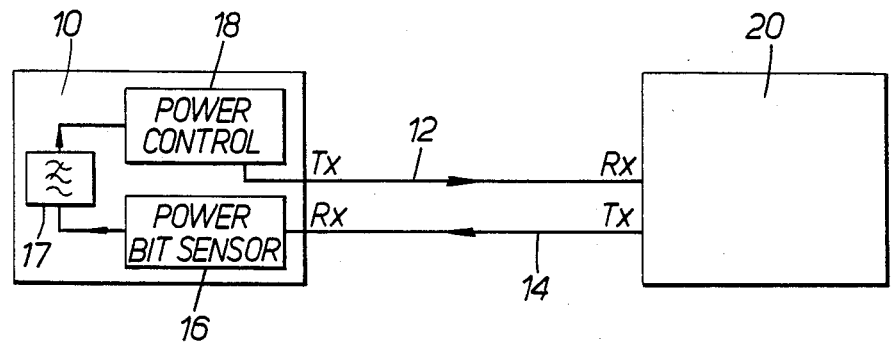
FIG. 1 represents a radio system in accordance with the present invention.

The radio system illustrated schematically in FIG. 1 comprises a pair of radio stations 10 and 20 which are capable of simultaneous transmission to each other. The transmission path from the transmitter of radio station 10 to the receiver of radio station 20 is denoted by the line 12 and, similarly, the transmission path from the transmitter of radio station 20 to the receiver at radio station 10 is denoted by the line 14.

The radios 10,20 may employ any appropriate modulation technique for transmitting digital data in a block format. The radios may employ a static carrier frequency or use a spread spectrum technique. The spread spectrum technique described in our co-pending British Patent Application No. 82.34991 may advantageously be used with the present power control technique.

Figure 2:
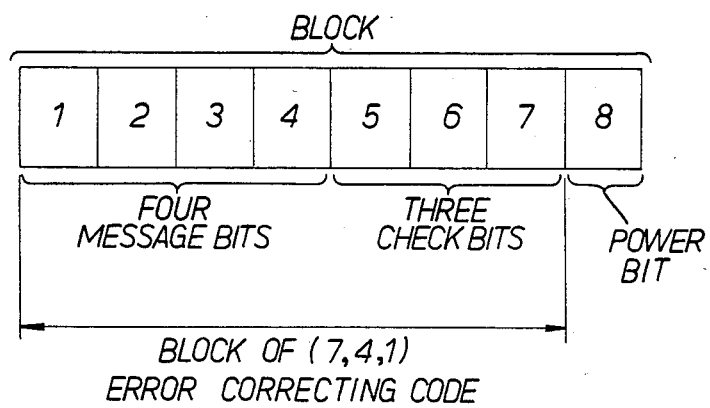
FIG. 2 represents a block of an error correction code for use in the radio system of FIG. 1.

Signals are transmitted between the radio stations 10 and 20 in digital form using an error correcting code, for example a (7,4,1) code. In such an error correcting code the data is transmitted in blocks which may be separated and defined by appropriate synchronisation signals. A typical block as used for transmission in the present system is illustrated in FIG. 2. This block consists of eight data bit positions of which the first seven are taken up with any conventional (7,4,1) error correcting code. In such a code the first four bit positions may be regarded as message bits, whilst the following three bits introduce sufficient redundancy to enable the presence of up to one error in the trasmitted seven data bit block to be detected. Any suitable technique can be used for converting a message to be transmitted into a digital data stream which is encoded with the selected (7,4,1) error correcting code and transmitted as the first seven bits of each block. At the receiving station the first seven bits of a received block are decoded by, for example, comparing with the contents of a stored look-up table. During the decoding process it is possible to determine whether there has been one error in transmission of the code block. It will be appreciated that if more powerful error correcting codes with increased redundancy are employed relatively more errors per block can be detected and/or corrected in dependance on the type of code employed.

Data bit position 8 is taken up by a power bit which is set in dependance on the error level detected in a sample of data received by the transmitting station from the receiving station. This power bit is a feed back signal which enables the station to alter its transmitted power in dependence on the error level in the transmission as received by the other station. The value of the power bit is determined by the error level in a sample of received blocks taken over a time interval of, say, one millisecond. The number of blocks received in such a time interval will clearly vary in dependance on the transmission rate. Assuming that the transmission rate is such that sixteen complete blocks are received in the selected sampling time interval, then if the error level in those sixteen blocks, as determined by the decoding of the data transmitted using the (7,4,1) error correcting code in the receiver, is above a preset error threshold, the power bit to be transmitted in the next sixteen blocks transmitted by the receiving station will be set high. If the detected error level is below the threshold the power bits transmitted in those blocks will be set low and, if the error level falls exactly on the error threshold, then the power bits of the next sixteen blocks can be set alternately high and low. It will be appreciated that the power bit in a transmitted block relates not to the error level in the transmission in which it is contained but the transmission being received from the other radio station by the station transmitting the power bit. If the error rate of the transmission is low it is possible that there may be no error recorded in the available sampling time or the sampling time would have to be too long to enable the power tracking to be effective. In such circumstances instead of measuring the number of errors occurring in a fixed sampling interval, the mean time between errors is monitored over a period to provide an indication of error level. The mean time is compared with a preset threshold and the succeeding power bits are set accordingly.

Both radio stations 10 and 20 include a power bit sensor 16. This power bit sensor detects whether the power bit at poisition 8 in each received block is a 0 or a 1. The power bit sensor 16 is coupled to a power control device 18 via a stabilising low pass analogue filter 17. The device 18 sets the trasmitted output power from the radio transmitter, if the received power bit is high then the power control device operates to increase the transmitted power level. The power control device 18 is preferably a continuously variable slope delta demodulator which operates so as to continuously change the output power, the received power bit being utilised to govern the rate of change.

Thus if the received power bit is 0, indicative of the error level in a sample received by the other radio station being below the threshold, the power control device 18 operates either to increase the rate by which the output power is falling if the previosly received power bit was also 0, or, if the previous power bit was 1 and so the output power was increasing, to cause the output power to start to fall. It will be appreciated that the amounts by which the rate of change of output power may be varied in particular conditions can be selected in dependance on the characterstics of the fading which is to be tracked. The time constants of the rates at which power is increased and decreased are preferably selected to be different. Further increases in the rate of power rise or fall are preferably nonlinear. This provides a less recognisable signature for detection by enemy ESM equipment. Moreover this provision makes it difficult for an intelligent jammer to make the system oscillate by suitable interference.

If the two radio stations 10,20 are, for example, 30 kilometers apart, the transmission time between them will be approximately 100 microseconds. Therefore there will be a time delay of approximately 1 millisecond plus 200 microseconds between the time when the blocks making up a sample are transmitted from one radio station and the power bit which provides an indication of whether the error level in the received sample is above or below the threshold value, is received in a block transmitted from the other radio station to the originating radio station.

Typically, fading of a transmitted signal may occur at a rate of the order of 50 times a second. Therefore the duration of a signal fade will be approximately 20 milliseconds. With the above mentioned delay between the error sampling and the time the power bit is returned to the transmitter to enable satisfactory restoration of the minimum power level, it is readily possible to track a fade which has a duration of 20 milliseconds with a system in which the mean bit error rate is of the order of 1 in $10^3$. In a typical fade the rate of attenuation may rapidly increase particularly towards the point of maximum attenuation of the fade. For this reason it is desirable to use the above mentioned continuously variable slope delta modulation. It will be appreciated that where the mean error rate of the transmission is lower the minimum duration of a trackable signal fade will become proportionally longer. Some improvement may be obtained by detecting the error level by monitoring the mean time between errors occurring.

In certain circumstances it is not necessarily desirable to track fades of extremely short duration as they do not normally effect transmission adversely enough particularly if the system is being used for voice communications. Such short fades may for example be due to multipath effects where one path includes a reflection of the signal from a fast moving aircraft. By not tracking such short fades the overall power output is kept to a minimum thus reducing the chances of the radio system being detected by enemy ESM equipment. Moreover increasing the power output may not be advantageous in compensating for such short duration fades due to multipath effects as the increased power may be equally applied to both paths resulting in continued cancellation of the received signal.

The block format which has been illustrated in FIG. 2 is not the only one suitable for use in the present system. In particular, it is possible to employ any type of error correcting code that enables the error level in a sample to be monitored. Moreover the particular order of the data bit positions illustrated is not essential. For example the bit positions may be rotated in each successive block so that the bit position occupied by the power bit is moved by one place in each succesive block. Alternatively the bit positions could be 'shuffled' in accordance with a predetermined pseudorandom sequence between successive blocks.

In such a system each transmitter and receiver would contain a sequence generator, for example an EPROM in which at least one suitable pseudorandom sequence of say, 128 bits or 16 blocks duration. The sequence would determine the order of bits for each of these sixteen blocks. It is also possible for the sequence to specify that in some blocks the sense of the power bit is to be inverted, ie from a 0 to 1 or vice versa. Both transmitter and receiver must employ the same sequence and initially synchronisation must be provided. This may be done by means of a test transmission in which the transmitter sequence generator is started at an abitrary point and the receiver decodes the received data with its sequence generator started at an arbitrary point and measuring the error rate for a test period before adjusting the synchronisation of its sequence generator and initiating a further test period. In this way the receiver sequence generator is stepped successively through each possible synchronisation. The correct synchronisation is then readily apparent as there will only be one test period in which the error rate is not extremely high Resynchronisation may be necessary after prolonged operation or if the system is not active for some time. A resynchronisation operation can also be initiated if the error rate exceeds a preset level likely to be due to synchronisation errors rather than transmission conditions. In order to provide even greater resistance to intelligent jamming, each sequence generator may contain several key-selectable sequences which may be used and charged as required. The particular sequence to be used and any required changes must be known by both transmitter and receiver.

It will further be appreciated that, although a sixteen block sampling system has been described, any suitable sample size may be employed, provided only that the returned power bit is representative of the received error level. Additionally it would also be possible to employ overlapping samples of blocks so as to prevent too large a number of identical power bits being transmitted.

We claim:

1. A radio system for simultaneous digital communications between two radio stations using data blocks each of which includes a plurality of message bits and at least one non-message bit, each radio station including
    transmitting means,
    receiving means,
    power supply means operatively connected to said transmitting means for controlling the output power thereof,
    means for encoding data to be transmitted with a forward error correcting code, said encoding means having an output connected to said transmitting means for blocks of said message bits,
    means connected to said receiving means for decoding said message bits received from the transmitting means of the other radio station,
    means operatively connected to said decoding means for determining an error level in a sample of the received blocks in relation to a predetermined threshold value, and
    means operatively connected to said determining means and said transmitting means for setting the or one non-message bit to be transmitted by the receiving station to the transmitting station to control the power supply means of the transmitting station to increase the transmitted signal power if the error level exceeds said threshold or decrease the transmitted signal power to maintain reception, and
    means operatively connected to said power supply means at each station for sensing the setting of said non-message bit to adjust the power of the transmitted signal.

2. A system as claimed in claim 1, wherein the error level is determined by monitoring the mean time between the occurence of errors.

3. A system as claimed in claim 1, wherein said error correcting code is a (7,4,1) code.

4. A system as claimed in claim 1, wherein the sensing means employs a continuously variable slope delta demodulator to determine the rate at which the transmitted power is to be adjusted in dependence on the setting of the received non-message bits.

5. A system as claimed in claim 1, wherein the power adjusting means are arranged such that the time constant of an increase in power is different from the time constant of a decrease in power.

6. A method for use in a radio system wherein two radio stations are transmitting to each other, of controlling the transmitted power of a radio signal such that a minimum power level to ensure efficient reception is maintained, comprising the steps of encoding the data to be transmitted using a forward error correcting code which produces blocks of bits for transmission, decoding the received transmission and deriving an error level in the received transmission from the other station, and periodically transmitting to the other station an indication of whether the transmitted power should be increased or decreased in dependence on whether the error level detected immediately prior to transmission of said indication was above or below a predetermined value respectively, said indication being transmitted as a bit accompanying each block of coded data.

7. A method as claimed in claim 6, wherein the rate and sense of the change in transmitted power is determined by the received indication.

8. A method as claimed in claim 6, wherein the step of detecting the error level comprises the step of monitoring the mean time between occurrences of errors.

* * * * *